United States Patent [19]

Oda et al.

[11] 4,081,696

[45] Mar. 28, 1978

[54] CURRENT SQUARING CIRCUIT

[75] Inventors: Minoru Oda; Shinzi Badono, both of Amagasaki, Japan

[73] Assignee: Mitsubishi Denki Kabushiki Kaisha, Tokyo, Japan

[21] Appl. No.: 740,724

[22] Filed: Nov. 10, 1976

[30] Foreign Application Priority Data

Nov. 17, 1975 Japan ............................... 50-137976

[51] Int. Cl.[2] ............................................ H03K 17/00

[52] U.S. Cl. .................................... 307/229; 307/255; 307/297

[58] Field of Search ............... 307/296, 297, 255, 229; 324/4, 9; 330/19

[56] References Cited

U.S. PATENT DOCUMENTS

| | | | |
|---|---|---|---|
| 3,681,623 | 8/1972 | Hoffman, Jr. et al. | 307/297 |
| 4,016,435 | 4/1977 | Voormah | 307/297 |

*Primary Examiner*—Stanley D. Miller, Jr.
*Assistant Examiner*—B. P. Davis
*Attorney, Agent, or Firm*—Wenderoth, Lind & Ponack

[57] ABSTRACT

This squaring circuit has an input connected to the collector of a PNP transistor which has its emitter connected to the emitter of an NPN transistor. This NPN transistor has the collecotor maintained at a predetermined voltage and the base connected to the base of another NPN transistor. The latter NPN transistor has the collector connected to both a source of constant current and its base, and has the emitter maintained at a predetermined voltage and connected to the emitter of another PNP transistor which has its collector connected to an output of the circuit and its base connected to the base and the collector of the first mentioned PNP transistor which has its collector connected to the input. Both PNP transistors have approximately the same characteristics as both NPN transistors.

4 Claims, 1 Drawing Figure

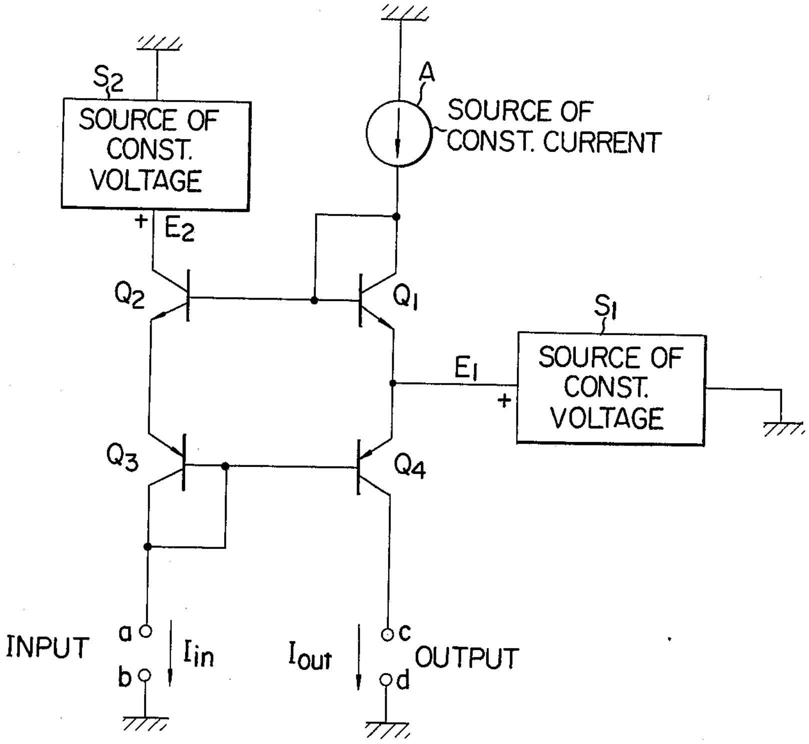
S2
SOURCE OF
CONST.
VOLTAGE
+ E2
A
SOURCE OF
CONST. CURRENT
Q2
Q1
S1
E1
+
SOURCE OF
CONST.
VOLTAGE
Q3
Q4
INPUT
a
b
Iin
Iout
c
d
OUTPUT

CURRENT SQUARING CIRCUIT

BACKGROUND OF THE INVENTION

This invention relates to a current squaring circuit for producing an output current having a magnitude proportional to the square of the magnitude of the input current applied thereto.

There are known electric devices performing the function of electrically squaring an electrical quantity, such as wattmeters employing differential thermocouples, squaring circuits utilizing a broken line approximation, and analog multipliers, etc. In such electric devices, the input and output have a narrow effective range and the operating range over which the output has a relative error less than 1% is only one or two decades.

Accordingly it is an object of the present invention to eliminate the disadvantages of the prior art practice as above described by the provision of a current squaring circuit having an effective range of about three decades for the input and about six decades for the output while being operative at a frequency equal to or higher than 100 kilohertz with a relative error maintained at about 1% over the entire effective range.

It is another object of the present invention to provide a new and improved current squaring circuit capable of compensating for differences in characteristics between the transistors used.

SUMMARY OF THE INVENTION

The present invention provides a circuit for squaring a current, comprising, in combination, a first transistor of a first type conductivity having the emitter electrode maintained at a first predetermined fixed voltage and the base electrode and the collector electrode connected to each other and to a source of constant current, a second transistor of the first type conductivity having the collector electrode maintained at a second predetermined fixed voltage, and the base electrode connected to the base electrode of the first transistor, a third transistor of a second type conductivity having the emitter electrode connected to the emitter electrode of the second transistor and the base electrode and the collector electrode connected to each other and to one of a pair of input terminals for the input signal current, and a fourth transistor of the second type conductivity having the emitter electrode connected to the emitter electrode of the first transistor, the base electrode connected to the base electrode of the third transistor and the collector electrode connected to one of a pair of current output terminals for the output signal.

In a preferred embodiment of the present invention, the first and second transistors may be of the NPN type and the third and fourth transistors are of the PNP type or vice versa.

BRIEF DESCRIPTION OF THE DRAWINGS

The present invention will become more readily apparent from the following detailed description taken in conjunction with the accompanying drawing wherein a single FIGURE illustrates a circuit diagram of one embodiment of the current squaring circuit of the present invention.

DESCRIPTION OF THE PREFERRED EMBODIMENT

In the preferred embodiment of the present invention shown in the FIGURE, a first NPN type transistor $Q_1$ has the emitter electrode connected to a reference potential through a first source of constant voltage $S_1$, and the base and the collector electrode connected to each other and to the reference potential through a source of constant current A. A second NPN type transistor $Q_2$ has the collector electrode connected to the reference potential through a second source of constant voltage $S_2$, the base electrode connected to the base electrode of the first transistor $Q_1$ and the emitter electrode connected to the emitter electrode of a third transistor $Q_3$ of the PNP type which has the base and the collector electrode connected to each other and to terminal *a* one of a pair of input terminals for the input signal current with the other input terminal *b* connected to the reference or ground potential. The base electrode of the third transistor $Q_3$ is connected to the base electrode of a fourth transistor $Q_4$ of the PNP type which has the emitter electrode connected to both the emitter electrode of the first transistor $Q_1$ and the first source of constant voltage $S_1$ and the collector electrode connected to terminal *c* one of a pair of output terminals, for the output signal current. The other output terminal *d* is connected to the reference or ground potential.

In operation, the input signal current $I_{in}$ flows through the transistors $Q_2$ and $Q_3$ and the voltage developed at the collector electrode of the transistor $Q_3$ is applied to the base electrode of the transistor $Q_4$ to control the collector current thereof. This collector current provides the output signal current $I_{out}$ proportional to the square of the input signal current $I_{in}$ as will be subsequently described in detail.

The transistor $Q_1$ serves to impart to the base electrode of the transistor $Q_2$ a base voltage related to the voltage $E_1$ of source $S_1$ that is in turn adjusted by the magnitude of current from the source of constant current A.

It is now assumed that all the transistors $Q_1$, $Q_2$, $Q_3$ and $Q_4$ are identical in characteristics to one another and for a given collector current of $I_o$, all the transistors have a common base-to-emitter voltage of $V_o$. It is also assumed that the $I_o$ and $V_o$ are of 1 milliampere and 0.6 volt respectively.

As well known, the collector current $I_o$ of each transistor is expressed by $$I_c = I_o e^{\frac{q}{kT}(V - V_o)} \tag{1}$$

where *V* designates a base-to-emitter voltage, *q* an electric charge of an electron, *k* a Boltzmann's constant and *T* designates an absolute temperature.

Assuming that the source of constant current A produces an output current of $I_o$ (which is of 1 milliampere in this example) and each of the transistors has a direct current-amplification factor of $\beta$, the respective transistors have the following relationships between a voltage and a current:

The first transistor $Q_1$ has a collector current $I_{c1}$ = expressed by $$I_c 1 \frac{I_o - \frac{I_{c2}}{\beta}}{1 + \frac{1}{\beta}} = I_o e^{\frac{q}{kT}(V - V_O)} \quad (2)$$

The second transistor $Q_2$ has a collector current $I_{c2}$ expressed by $$I_{c2} = \frac{I_{in}}{1 + \frac{1}{\beta}} = I_o e^{\frac{q}{kT}(V_2 - V_O)} \quad (3)$$

The third transistor $Q_3$ has a collector current $I_{c3}$ expressed by $$I_{c3} = \frac{I_{in}}{1 + \frac{1}{\beta}} = I_o e^{\frac{q}{kT}(V_3 - V_O)} \quad (4)$$

and the fourth transistor $Q_4$ has a collector current $I_{c4}$ expressed by $$I_{c4} = I_o e^{\frac{q}{kT}(V_2 + V_3 - V_1 - V_O)} \quad (5)$$

In the above equations $V_1$, $V_2$, $V_3$ and $V_4$ designate base-to-emitter voltages of the transistors $Q_1$, $Q_2$, $Q_3$ and $Q_4$ respectively.

Due to the connection of its base to its collector electrode, each of the transistors $Q_1$ or $Q_3$ has an emitter-to-collector voltage equal to a base-to-emitter voltage thereof. However the transistors $Q_2$ and $Q_4$ have emitter-to-collector voltages as determined by the sources of constant voltage $S_1$ and $S_2$ respectively. In order to render the emitter-to-collector voltages of the respective transistors substantially equal to one another, the sources $S_1$ and $S_2$ provide preferably output voltages $E_1$ and $E_2$ nearly equal to the $V_o$ and twice the $V_o$ respectively. By multiplying the equation (3) by the equation (4) and then dividing by the equation (2), there is given $$I_{c4} = \frac{I_{in}^2}{1 + \frac{1}{\beta}} \cdot \frac{1}{I_o - \frac{I_{c2}}{\beta}}$$

substituting equation (3) into the above equations for $I_{c2}$ yields $$I_{c4} = \frac{I_{in}^2}{1 + \frac{1}{\beta}} \cdot \frac{1}{I_o - \frac{I_{in}}{(1 + \beta)}} = \frac{\beta}{1 + \beta} \cdot \frac{I_{in}^2}{I_O - \frac{I_{in}}{(1 + \beta)}} \quad (6)$$

Since the current-amplification factor $\beta$ has a value on the order of 100, $\beta/(1+\beta)$ has a value substantially equal to 1. Also if the input signal current $I_{in}$ has a maximum magnitude of 1 milliampere that is equal to the magnitude of $I_o$ then the equation (6) has a denominator $I_o - I_{in}/(1+\beta)$ substantially equal in magnitude to the $I_o$. The total error resulting from the two approximations just described is on the order of 1%. With those approximations permissible, the equation (6) can be reduced to $$I_{c4} = \frac{I_{in}^2}{I_o} = I_{out} \quad (7)$$

The equation (7) describes that the output signal current $I_{out}$ is proportional to the square of the input signal current $I_{in}$.

In the foregoing it has been assumed that all the transistors have a magnitude of the base-to-emitter voltage $V_o$ equal to one another for the collector current thereof having a predetermined common magnitude $I_o$ such as 1 milliampere. However transistors actually available are slightly different in base-to-emitter voltage from one to another. This means that the square characteristic represented by the equation (7) is attended with a factor having a value not equal to 1. Therefore it becomes necessary to adjust the gain obtained between the input and the output of the current squaring circuit. To this end, the arrangement illustrated can be provided with a means for adjusting the output current from the source of constant current A to control the emitter-to-collector $V_1$ of the transistor $Q_1$ thereby to compensate for the unequal $V_o$'s.

In the FIGURE the transistors $Q_1$ and $Q_2$ are shown as being of the NPN type and the transistors $Q_3$ and $Q_4$ are shown as being of the PNP type, the selection of the transistors is facilitated by taking account of the fact that it is required only to impart a common magnitude of the voltage $V_o$ to the pair of transistors $Q_1$ and $Q_2$ while the other pair of transistors $Q_3$ and $Q_4$ has the same voltage $V_o$. That is, since identical transistors can be used as a pair of transistors having the same type conductivity, transistors which are equal in the magnitude of the voltage $V_o$ to each other are readily be available.

The range of input signal current with which the circuit can retain the square characteristic has a lower limit as determined by the decrease in direct current-amplification factor due to the reduction in collector current of each of the transistors $Q_2$ and $Q_3$, the reverse saturation current flowing across the base and collector electrodes of the transistor $Q_4$ etc. and an upper limit as determined by the increase in base current of each of the transistors $Q_2$ and $Q_4$, heat generated by the respective transistors etc. With high frequency silicon transistors for use with small signals properly selected as the transistors $Q_1$ through $Q_4$, it has been found that a signal range over which the square characteristic can be retained is about three decades with respect to the input and about six decades with respect to the output. For example, the input signal current $I_{in}$ typically ranges from 1 microampere to 1 milliampere and the output signal current $I_{out}$ ranges from 1 nano-ampere to 1 milliampere.

While the transistor $Q_4$ which supplies the output signal current undergoes the greatest charge in current, a reduction in the direct current-amplification factor $\beta$ thereof in a low current range causes no error in the output signal current directly. Since the base current of the transistor $Q_4$ is negligible with respect to the collector current of the transistor $Q_3$ even in the region in which the base transistor current of transistor $Q_4$ is not negligible with respect to the collector current thereof due to a decrease in the direct current-amplification factor $\beta$, the arrangement shown retains the square characteristic. This is because the collector current of the transistor $Q_4$ decreases more sharply than the collector currents of the transistors $Q_2$ and $Q_3$ in the low current region. It has been found that, with the current amplification factor $\beta$ of the transistor $Q_4$ decreased to 0.1, at an operating point having input and output signal currents of 1 microampere and 1 nano-ampere respectively this decrease in amplification factor actually imparts an error of about 2% to the square characteristic. A good frequency response exhibited in the low current region by the circuit of the present invention. For the same reason, the circuit has an upper frequency response limit equal to the frequency at which the alternating current-amplification factor decreases to the order of 0.1. This FIGURE permits an upper frequency response limit of 100 kiloherlz or more when small signal high frequency transistors are used.

Thus it can be seen that the present invention has provided a square characteristic circuit having a wide operational range previously not obtained with an extremely simple circuit configuration including a combination of one pair of NPN type transistors, another pair of PNP type transistors, a source of constant current and a pair of sources of constant voltage, the transistors in each pair having approximately the same characteristics. Therefore a present invention has the high utility value in the fields of the instrumentation, control, etc.

While the present invention has been illustrated and described in conjunction with a single preferred embodiment thereof it is to be understood that numerous changes and modifications may be resorted to without departing from the spirit and scope of the present invention. For example, the transistors along with the sources may be reversed in polarity from those illustrated.

What we claim is:

1. A circuit for squaring current, comprising, in combination, a first predetermined fixed voltage source, a second predetermined fixed voltage source, a source of constant current, a first transistor of a first type conductivity having the emitter electrode connected to said first predetermined fixed voltage source and the base electrode and the collector electrode connected to each other and to said source of constant current, a second transistor of the first type conductivity having the collector electrode connected to said second predetermined fixed voltage source, and the base electrode connected to said base electrode of said first transistor, a third transistor of a second type conductivity having the emitter electrode connected to the emitter electrode of said second transistor and the base electrode and the collector electrode connected to each other and to one of pair of input terminals for the input signal current, and a fourth transistor of the second type conductivity having the emitter electrode connected to said emitter electrode of said first transistor, the base electrode connected to said base electrode of said third transistor and the collector electrode connected to one of a pair of output terminals for the output signal current, whereby the magnitude of the current passing through the output terminals is the square of the magnitude of the current passing through the input terminals.

2. A circuit for squaring current as claimed in claim 1 wherein said first and second transistors are of the NPN type and said third and fourth transistors are of the PNP type.

3. A circuit for squaring curent as claimed in claim 1 wherein said first and second transistors are of the PNP type and said third and fourth transistors are of the NPN type.

4. A circuit for squaring current as claimed in claim 1 wherein said source of constant current includes current adjusting means for adjusting the output current from said source of constant current.

* * * * *